(12) United States Patent
Walter et al.

(10) Patent No.: US 8,509,274 B2
(45) Date of Patent: Aug. 13, 2013

(54) LIGHT EMITTING AND LASING SEMICONDUCTOR METHODS AND DEVICES

(75) Inventors: Gabriel Walter, Champaign, IL (US); Nick Holonyak, Jr., Urbana, IL (US); Milton Feng, Champaign, IL (US); Chao-Hsin Wu, Champaign, IL (US)

(73) Assignees: Quantum Electro Opto Systems Sdn. Bhd., Melaka (MY); The Board of Trustees of The University of Illilnois, Urbana, IL (US)

( * ) Notice: Subject to any disclaimer, the term of this patent is extended or adjusted under 35 U.S.C. 154(b) by 165 days.

(21) Appl. No.: 12/799,080

(22) Filed: Apr. 16, 2010

(65) Prior Publication Data

US 2010/0289427 A1    Nov. 18, 2010

Related U.S. Application Data

(63) Continuation-in-part of application No. 12/655,806, filed on Jan. 7, 2010.

(60) Provisional application No. 61/204,560, filed on Jan. 8, 2009, provisional application No. 61/204,602, filed on Jan. 8, 2009, provisional application No. 61/208,422, filed on Feb. 24, 2009, provisional application No. 61/212,951, filed on Apr. 17, 2009, provisional application No. 61/268,119, filed on Jun. 9, 2009.

(51) Int. Cl.
*H01S 3/00* (2006.01)

(52) U.S. Cl.
USPC ............ 372/38.05; 372/29.013; 372/87; 257/13

(58) Field of Classification Search
USPC ............ 372/29.013, 38.05, 87; 257/13
See application file for complete search history.

(56) References Cited

U.S. PATENT DOCUMENTS

| 4,176,367 A | 11/1979 | Uematsu | 357/19 |
| 4,513,423 A * | 4/1985 | Katz et al. | 372/50.1 |

(Continued)

FOREIGN PATENT DOCUMENTS

JP    61270885    12/1986

OTHER PUBLICATIONS

Electrical-Optical Signal Mixing and Multiplication (2 → 22 GHz) With a Tunnel Junction Transistor Laser, H.W. Then, C.H. Wu, G. Walter, M. Feng and N. Holonyak, Jr., Appl. Phys. Lett. 94, 10114 (2009).

(Continued)

*Primary Examiner* — Tod T Van Roy
(74) *Attorney, Agent, or Firm* — Martin Novack

(57) ABSTRACT

A method for producing light emission from a two terminal semiconductor device with improved efficiency, includes the following steps: providing a layered semiconductor structure including a semiconductor drain region comprising at least one drain layer, a semiconductor base region disposed on the drain region and including at least one base layer, and a semiconductor emitter region disposed on a portion of the base region and comprising an emitter mesa that includes at least one emitter layer; providing, in the base region, at least one region exhibiting quantum size effects; providing a base/drain electrode having a first portion on an exposed surface of the base region and a further portion coupled with the drain region, and providing an emitter electrode on the surface of the emitter region; applying signals with respect to the base/drain and emitter electrodes to obtain light emission from the base region; and configuring the base/drain and emitter electrodes for substantial uniformity of voltage distribution in the region therebetween.

14 Claims, 10 Drawing Sheets

(56) References Cited

U.S. PATENT DOCUMENTS

| | | | |
|---|---|---|---|
| 5,796,714 A | 8/1998 | Chino et al. | 372/50 |
| 7,091,082 B2 | 8/2006 | Feng | 438/235 |
| 7,286,583 B2 | 10/2007 | Feng et al. | 372/30 |
| 7,354,780 B2 | 4/2008 | Feng et al. | 257/292 |
| 7,535,034 B2 | 5/2009 | Walter et al. | 372/43 |
| 7,711,015 B2 | 5/2010 | Holonyak et al. | 372/11 |
| 7,813,396 B2 | 10/2010 | Feng et al. | 372/43.01 |
| 2001/0050934 A1 | 12/2001 | Choqnette et al. | 372/43 |
| 2005/0040387 A1 | 2/2005 | Feng et al. | 257/14 |
| 2005/0040432 A1 | 2/2005 | Feng et al. | 257/198 |
| 2005/0054172 A1 | 3/2005 | Feng | 438/313 |
| 2006/0093010 A1 | 5/2006 | Sekiya et al. | 372/99 |
| 2006/0109883 A1* | 5/2006 | Lewis et al. | 372/50.12 |
| 2007/0201523 A1* | 8/2007 | Walter et al. | 372/43.01 |
| 2008/0089368 A1 | 4/2008 | Feng et al. | 372/25 |
| 2008/0205461 A1 | 8/2008 | Henrichs | 372/29.023 |
| 2008/0240173 A1 | 10/2008 | Holonyak et al. | 372/9 |
| 2009/0134939 A1 | 5/2009 | Feng et al. | 327/581 |
| 2010/0034228 A1 | 2/2010 | Holonyak et al. | 374/45 |
| 2010/0073086 A1 | 3/2010 | Holonyak, Jr. et al. | 330/149 |
| 2010/0103971 A1 | 4/2010 | Then et al. | 372/45.01 |
| 2010/0315018 A1 | 12/2010 | Then et al. | 315/291 |

OTHER PUBLICATIONS

Scaling of Light Emitting Transistor for Multigigahertz Optical Bandwidth, C.H. Wu, G. Walter, H.W. Then, M. Feng and N. Holonyak, Jr., Appl. Phys. Lett. 94, 171101 (2009).

Device Performance of Light Emitting Transistors With C-Doped and Zn-Doped Base Layers, Y. Huang, J.-H. Ryou, R.D. Dupuis, F. Dixon, N. Holonyak, Jr., and M. Feng, IPRM '09 IEEE Intl. Conf. May 10-14, 2009.

Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004).

Quantum-Well-Base Heterojunction Bipolar Light-Emitting Transistor, M. Feng, N. Holonyak, Jr., and R. Chan, Appl. Phys. Lett. 84, 1952 (2004).

Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004).

Laser Operation of a Heterojunction Bipolar Light-Emitting Transistor, G. Walter, N. Holonyak, Jr., M. Feng, and R. Chan, Appl. Phys. Lett. 85, 4768 (2004).

Microwave Operation and Modulation of a Transistor Laser, R. Chan, M. Feng, N. Holonyak, Jr., and G. Walter, Appl. Phys. Lett. 86, 131114 (2005).

Room Temperature Continuous Wave Operation of a Heterojunction Bipolar Transistor Laser, M. Feng, N. Holonyak, Jr., G. Walter, and R. Chan, Appl. Phys. Lett. 87, 131103 (2005).

Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006).

The Transistor Laser, N. Holonyak, M Feng, Spectrum, IEEE vol. 43, Issue 2, Feb. 2006.

Signal Mixing in a Multiple Input Transistor Laser Near Threshold, M. Feng, N. Holonyak, Jr., R. Chan, A. James, and G. Walter, Appl. Phys. Lett. 88, 063509 (2006).

Collector Current Map of Gain and Stimulated Recombination on the Base Quantum Well Transitions of a Transistor Laser, R. Chan , N. Holonyak, Jr. , A. James , G. Walter, Appl. Phys. Lett. 88, 143508 (2006).

Collector Breakdown in the Heterojunction Bipolar Transistor laser, G. Walter, A. James, N. Holonyak, Jr., M. Feng, and R. Chan, Appl. Physics Lett. 88, 232105 (2006).

High-Speed ($\geqq 1$ GHz) Electrical and Optical Adding, Mixing, and Processing of Square-Wave Signals With a Transistor Laser, M. Feng, N. Holonyak, Jr., R. Chan, A. James, and G. Walter, IEEE Photonics Technology Lett., vol. 18, No. 11, Jun. 1, 2006.

Graded-Base InGaN/GaN Heterojunction Bipolar Light-Emitting Transistors, B.F. Chu-Kung, M. Feng, G. Walter, and J. Holonyak, Jr. et al., Appl. Physics Lett. 89, 082108 (2006).

Carrier Lifetime and Modulation Bandwidth of a Quantum Well AlGaAs/InGaP/GaAs/InGaAs Transistor Laser, M. Feng, N. Holonyak, Jr., A. James, K. Cimino, G. Walter, and R. Chan, Appl. Phys. Lett 89, 113504 (2006).

Chirp in a Transistor Laser: Franz-Keldysh Reduction of the Linewidth Enhancement, G. Walter, A. James, N. Holonyak, Jr., and M. Feng, App. Phys. Lett. 90, 091109 (2007).

Photon-Assisted Breakdown, Negative Resistance, and Switching in a Quantum-Well Transistor Laser, A. James, G. Walter, M. Feng, and N. Holonyak, Jr., Appl. Phys. Lett. 90, 152109 (2007).

Franz-Keldysh Photon-Assisted Voltage-Operated Switching of a Transistor Laser, A. James, N. Holonyak, M. Feng, and G. Walter, Photonics Technology Letters, IEEE vol. 19 Issue: 9 (2007).

Experimental Determination of the Effective Minority Carrier Lifetime in the Operation of a Quantum-Well n-p-n Heterojunction Bipolar Light-Emitting Transistor of Varying Base Quantum-Well Design and Doping; H.W. Then, M. Feng, N. Holonyak, Jr., and C. H. Wu, Appl. Phys. Lett. 91, 033505 (2007).

Charge Control Analysis of Transistor Laser Operation, M. Feng, N. Holonyak, Jr., H. W. Then, and G. Walter, Appl. Phys. Lett. 91, 053501 (2007).

Optical Bandwidth Enhancement by Operation and Modulation of the First Excited State of a Transistor Laser, H. W. Then, M. Feng, and N. Holonyak, Jr., Appl. Phys. Lett. 91, 183505 (2007).

Modulation of High Current Gain ($\beta > 49$) Light-Emitting InGaN/GaN Heterojunction Bipolar Transistors, B. F. Chu-Kung, C. H. Wu, G. Walter, M. Feng, N. Holonyak, Jr., T. Chung, J.-H. Ryou, and R. D. Dupuis, Appl. Phys. Lett. 91, 232114 (2007).

Collector Characteristics and the Differential Optical Gain of a Quantum-Well Transistor Laser, H. W. Then, G. Walter, M. Feng, and N. Holonyak, Jr., Appl. Phys. Lett. 91, 243508 (2007).

InAlGaAs/InP Light-Emitting Transistors Operating Near 1.55 µm, Yound Huang, Xue-Bing Zhang, Jae-Hyun Ryun, Russell D. Dupuis, Forest Dixon, Nick Holonyak, Jr., and Milton Feng., J. Appl. Phys. 103 114505 (2008).

Transistor Laser With Emission Wavelength at 1544 nm, F. Dixon, M. Feng, N. Holonyak, Jr., Yong Huang, X. B. Zhang, J. H. Ryou, and R. D. Dupuis, Appl. Phys. Lett. 93, 021111 (2008).

Optical Bandwidth Enhancement of Heterojunction Bipolar Transistor Laser Operation With an Auxiliary Base Signal, H.W. Then, G. Walter, M. Feng, and N. Holonyak, Jr., Appl. Phys. Lett. 93, 163504 (2008).

Bandwidth Extension by Trade-Off of Electrical and Optical Gain in a Transistor Laser: Three-Terminal Control, H. W. Then, M. Feng, and N. Holonyak, Jr., Appl. Phys. Lett. 94, 013509 (2009).

Tunnel Junction Transistor Laser, M. Feng, N. Holonyak, Jr., H. W. Then, C. H. Wu, and G. Walter, Appl. Phys. Lett. 94, 041118 (2009).

* cited by examiner

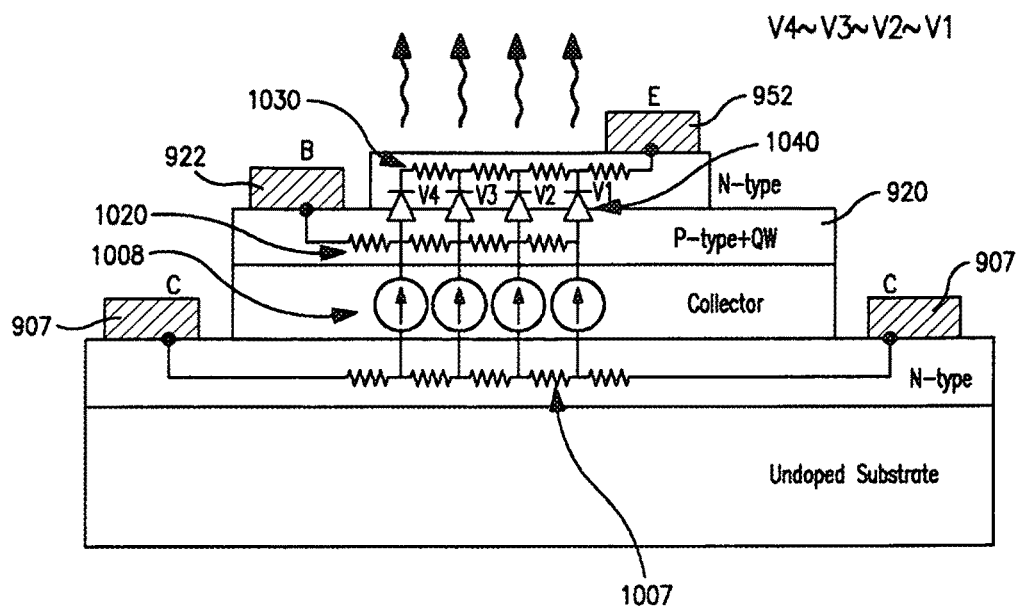
FIG. 10
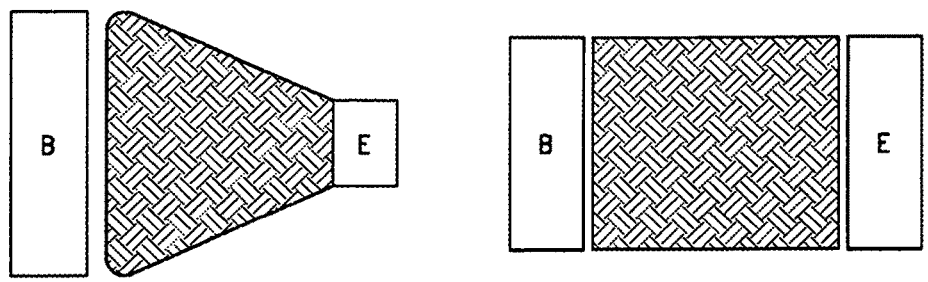
FIG. 11(a)  FIG. 11(b)

| Layer | Comment | Material | x | Thickness (A) | Type | Dopant | Level (/cm³) | Layer Description relative to Figure |
|---|---|---|---|---|---|---|---|---|
| 18 | Contact | GaAs | | 2000 | N+ | Si | 5.0E+18 | |
| 17 | Confining | Al(x)Ga(1-x)As | 0.3 | 500 | N | Si | 3.0E+18 | Cladding-N |
| 16 | Oxide Buffer | Al(x)Ga(1-x)As | 09.-0.3 | 212 | N | Si | 2.0E+18 | |
| 15 | Oxidizable Layer | Al(x)Ga(1-x)As | 0.980 | 595 | N | Si | 2.0E+18 | |
| 14 | Oxide Buffer | Al(x)Ga(1-x)As | 0.3-0.9 | 213 | N | Si | 2.0E+18 | |
| 13 | | In(x)Ga(1-x)P | 0.490 | 511 | N- | Si | 5.0E+17 | Emitter |
| 12 | Base Region 1* | Al(x)Ga(1-x)As | A | 162 | P | C | 5.0E+19 | Base-P |
| 11 | Quantum Well(s) | GaAs | 0.000 | 30 | i | UID | 1.0E+16 | Quantum Well (s) |
| 10 | Base Region 2* | Al(x)Ga(1-x)As | B | 106 | P | C | 2.0E+19 | Base-P |
| 9 | Drain | GaAs | 0.000 | 2871 | i | UID | 1.0E+16 | Drain |
| 8 | Etch Stop Layer | In(x)Ga(1-x)P | 0.490 | 120 | N- | Si | 3.0E+17 | |
| 7 | Sub-Drain/Contact | Al(x)Ga(1-x)As | 0.000 | 417 | N | Si | 5.0E+18 | Sub-Drain |
| 6 | Sub-Drain/Contact | Al(x)Ga(1-x)As | 0.000 | 140 | N | Si | 5.0E+18 | |
| 5 | Oxide Buffer | Al(x)Ga(1-x)As | 0.9-0.3 | 212 | N | Si | 2.0E+18 | |
| 4 | Oxidizable Layer | Al(x)Ga(1-x)As | 0.980 | 595 | N | Si | 2.0E+18 | |
| 3 | Oxide Buffer | Al(x)Ga(1-x)As | 0.3-0.9 | 213 | N | Si | 2.0E+18 | |
| 2 | Confining | Al(x)Ga(1-x)As | 0.3 | 500 | N | Si | 3.0E+18 | |
| 1 | Doped Buffer | GaAs | | 3000 | N | Si | 5.0E+18 | |
| | Substrate | 4" GaAs | | | SI(US) | | | |

FIG. 16

LIGHT EMITTING AND LASING SEMICONDUCTOR METHODS AND DEVICES

PRIORITY CLAIMS

This is a continuation-in-part of U.S. patent application Ser. No. 12/655,806, filed Jan. 7, 2010, incorporated herein by reference, which, in turn, claimed priority from three U.S. Provisional Patent Applications; namely, U.S. Provisional Application Ser. No. 61/204,560, filed Jan. 8, 2009, U.S. Provisional Application Ser. No. 61/204,602, filed Jan. 8, 2009, and U.S. Provisional Application Ser. No. 61/208,422, filed Feb. 24, 2009. Priority is also claimed from U.S. Provisional Patent Application Ser. No. 61/212,951, filed Apr. 17, 2009, and from U.S. Provisional Patent Application Ser. No. 61/268,119, filed Jun. 9, 2009, and both of said last mentioned U.S. Provisional Patent Applications are incorporated herein by reference.

RELATED APPLICATION

The subject matter of this Application relates to subject matter disclosed in copending U.S. patent application Ser. No. 12/799,083, filed of even date herewith and assigned to the same assignees as the present Application.

GOVERNMENT RIGHTS

This invention was made with Government support, and the Government has certain rights in the invention.

FIELD OF THE INVENTION

This invention relates to methods and devices for producing light emission and laser emission in response to electrical signals. The invention also relates to methods for producing light emission and laser emission from semiconductor devices with improved efficiency, and to increasing light output from semiconductor light-emitting devices.

BACKGROUND OF THE INVENTION

A part of the background hereof lies in the development of heterojunction bipolar transistors which operate as light-emitting transistors and transistor lasers. Reference can be made for example, to U.S. Pat. Nos. 7,091,082, 7,286,583, 7,354,780, 7,535,034 and 7,693,195; U.S. Patent Application Publication Numbers US2005/0040432, US2005/0054172, US2008/0240173, US2009/0134939, and US2010/0034228; and to PCT International Patent Publication Numbers WO/2005/020287 and WO/2006/093883. Reference can also be made to the following publications: Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004); Quantum-Well-Base Heterojunction Bipolar Light-Emitting Transistor, M. Feng, N. Holonyak, Jr., and R. Chan, Appl. Phys. Lett. 84, 1952 (2004); Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004); Laser Operation Of A Heterojunction Bipolar Light-Emitting Transistor, G. Walter, N. Holonyak, Jr., M. Feng, and R. Chan, Appl. Phys. Lett. 85, 4768 (2004); Microwave Operation And Modulation Of A Transistor Laser, R. Chan, M. Feng, N. Holonyak, Jr., and G. Walter, Appl. Phys. Lett. 86, 131114 (2005); Room Temperature Continuous Wave Operation Of A Heterojunction Bipolar Transistor Laser, M. Feng, N. Holonyak, Jr., G. Walter, and R. Chan, Appl. Phys. Lett. 87, 131103 (2005); Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006); The Transistor Laser, N. Holonyak and M Feng, Spectrum, IEEE Volume 43, Issue 2, February 2006; Signal Mixing In A Multiple Input Transistor Laser Near Threshold, M. Feng, N. Holonyak, Jr., R. Chan, A. James, and G. Walter, Appl. Phys. Lett. 88, 063509 (2006); and Collector Current Map Of Gain And Stimulated Recombination On The Base Quantum Well Transitions Of A Transistor Laser, R. Chan, N. Holonyak, Jr., A. James, and G. Walter, Appl. Phys. Lett. 88, 14508 (2006); Collector Breakdown In The Heterojunction Bipolar Transistor Laser, G. Walter, A. James, N. Holonyak, Jr., M. Feng, and R. Chan, Appl. Phys. Lett. 88, 232105 (2006); High-Speed (/spl ges/1 GHz) Electrical And Optical Adding, Mixing, And Processing Of Square-Wave Signals With A Transistor Laser, M. Feng, N. Holonyak, Jr., R. Chan, A. James, and G. Walter, Photonics Technology Letters, IEEE Volume: 18 Issue: 11 (2006); Graded-Base InGaN/GaN Heterojunction Bipolar Light-Emitting Transistors, B. F. Chu-Kung et al., Appl. Phys. Lett. 89, 082108 (2006); Carrier Lifetime And Modulation Bandwidth Of A Quantum Well AlGaAs/InGaP/GaAs/InGaAs Transistor Laser, M. Feng, N. Holonyak, Jr., A. James, K. Cimino, G. Walter, and R. Chan, Appl. Phys. Lett. 89, 113504 (2006); Chirp In A Transistor Laser, Franz-Keldysh Reduction of The Linewidth Enhancement, G. Walter, A. James, N. Holonyak, Jr., and M. Feng, Appl. Phys. Lett. 90, 091109 (2007); Photon-Assisted Breakdown, Negative Resistance, And Switching In A Quantum-Well Transistor Laser, A. James, G. Walter, M. Feng, and N. Holonyak, Jr., Appl. Phys. Lett. 90, 152109 (2007); Franz-Keldysh Photon-Assisted Voltage-Operated Switching of a Transistor Laser, A. James, N. Holonyak, M. Feng, and G. Walter, Photonics Technology Letters, IEEE Volume: 19 Issue: 9 (2007); Experimental Determination Of The Effective Minority Carrier Lifetime In The Operation Of A Quantum-Well n-p-n Heterojunction Bipolar Light-Emitting Transistor Of Varying Base Quantum-Well Design And Doping; H. W. Then, M. Feng, N. Holonyak, Jr., and C. H. Wu, Appl. Phys. Lett. 91, 033505 (2007); Charge Control Analysis Of Transistor Laser Operation, M. Feng, N. Holonyak, Jr., H. W. Then, and G. Walter, Appl. Phys. Lett. 91, 053501 (2007); Optical Bandwidth Enhancement By Operation And Modulation Of The First Excited State Of A Transistor Laser, H. W. Then, M. Feng, and N. Holonyak, Jr., Appl. Phys. Lett. 91, 183505 (2007); Modulation Of High Current Gain ($\beta$>49) Light-Emitting InGaN/GaN Heterojunction Bipolar Transistors, B. F. Chu-Kung, C. H. Wu, G. Walter, M. Feng, N. Holonyak, Jr., T. Chung, J.-H. Ryou, and R. D. Dupuis, Appl. Phys. Lett. 91, 232114 (2007); Collector Characteristics And The Differential Optical Gain Of A Quantum-Well Transistor Laser, H. W. Then, G. Walter, M. Feng, and N. Holonyak, Jr., Appl. Phys. Lett. 91, 243508 (2007); Transistor Laser With Emission Wavelength at 1544 nm, F. Dixon, M. Feng, N. Holonyak, Jr., Yong Huang, X. B. Zhang, J. H. Ryou, and R. D. Dupuis, Appl. Phys. Lett. 93, 021111 (2008); and Optical Bandwidth Enhancement Of Heterojunction Bipolar Transistor Laser Operation With An Auxiliary Base Signal, H. W. Then, G. Walter, M. Feng, and N. Holonyak, Jr. Appl. Phys. Lett. 93, 163504 (2008).

FIGS. 1 and 2 illustrate an example of an existing tilted charge light emitter; that is, a light-emitting transistor ("LET") as described in the above referenced patent documents and publications. An n+ GaAs subcollector region 105 has an n-type GaAs collector region 110 deposited thereon, followed by a p+ AlGaAs/GaAs base region 120, having an n-type InGaAs quantum well (QW) 126. An emitter mesa is deposited over the base, and includes n-type InGaP emitter layer 130, and n-type AlGaAs aperture layer 140, and an n+ GaAs cladding layer 150. Lateral oxidation can be conventionally used to obtain annular oxide 141 and form the central aperture. The collector electrode or contact metallization is shown at 107, the base contact metallization is shown at 122, and the emitter contact metallization is shown at 152. FIG. 2 shows a plan view of the FIG. 1 metallizations; that is, opposing collector contacts (common connection not shown), the base contact 122 including an outer annular ring, and the emitter contact 152 including an inner annular ring.

FIG. 1 also has arrows that illustrate the flow of electron current and hole current in typical light-emitting transistor operation. As described, for example, in the above referenced documents, light-emitting transistors, transistor lasers, and certain two terminal light emitters are sometimes referred to as "tilted charge" devices, owing to the "tilted" base charge distribution (as could be illustrated on the device band diagram) which locks the base electron-hole recombination in "competition" with the charge "collection" at the reverse-biased collector junction, thus selecting ("filtering") and allowing only "fast" recombination in the base (assisted by the quantum well(s)) at an effective lifetime of the order of picoseconds. [Reference can be made, for example, to the above-listed documents, including reference to a two-terminal tilted charge light emitter disclosed in U.S. Patent Application Publication No. US2010/0034228, and reference can also be made to U.S. patent application Ser. No. 12/655,806, filed Jan. 7, 2010, which is a parent application hereof.]

In existing tilted charge devices, the optical cavity or window, defined in part by an aperture formed with an oxide, is placed after the base and emitter contact. Due to the high base sheet resistant and large current gain (emitter current) of the tilted charge device, the voltage difference across the base emitter junction is the greatest along the edge defined by the oxide aperture. This forces the recombination events (which result in the desired optical output) to localize along the perimeter of the oxide aperture, as current injection is largest in the region where voltage difference is largest. The junction voltage decreases towards the center of the optical cavity. This phenomenon is represented in FIGS. 1 and 2, and can be further understood from the modeling of device operation as shown in the simplified circuit model of FIG. 3. In FIG. 3, the regions and contacts correspond with those of like reference numerals in FIG. 1. In the model, 307, 320, and 330 respectively represent the collector, base, and emitter resistances, 308 represents collector current components, and 340 represents the spatial components of base/emitter voltage. As was first seen in FIG. 1, the path of least resistance for electron conduction is along the edge defined by the oxide aperture. In the model of FIG. 3, this results in V4 being substantially greater than V3, and V1 being substantially greater than V2. This causes most of the recombination events to localize nearer the edge of the base layer, and less recombination at and near the center of the base layer (see sketch of light output representation of FIG. 2).

FIG. 4 is a graph showing detected optical output of the device (as detector photo current in μA) as a function of device base current (in mA). The optical output for larger emitter diameter devices saturates at larger base current input. Saturation of light is attributed to quantum well saturation.

In FIG. 5, the optical output density and emitter current density for different emitter sizes (and hence, aperture sizes) is conveniently normalized to the aperture perimeter "area" (shaded area of inset in FIG. 5.) The area is determined by assuming a constant shallow penetration into the optical cavity. The result indicates that recombination is localized along the edge of the device. Maximum light output is therefore determined by the active perimeter defined by the oxide aperture rather than the area of the total optical cavity.

FIG. 6 illustrates pulsed current measurement for various emitter sizes showing light output for both 10% and 50% pulsed current measurements to be substantially the same. Results indicate that light saturation for the device was not caused by heating but by localized quantum well saturation.

FIG. 7 is a top view photograph of the type of existing device of FIG. 1, wherein the collector (C), base (B), and emitter (E) metallizations are denoted, and the optical cavity or window is indicated by an arrow. The light-emitting transistor of the Figure has a 10 um emitter mesa and aperture defined optical cavity of 6 um. The optical cavity is located after the base and emitter contacts (i.e., above them, as in FIG. 1). The active perimeter of this device is therefore about 18 μm. Similarly, FIG. 8 shows an existing tilted charge light-emitting diode (see, for example, copending U.S. patent application Ser. No. 12/655,806, filed Jan. 7, 2010, assigned to the same assignees as the present Application), wherein the emitter (E) and base/drain (BD) metallizations are denoted and, again, the device has a 10 um emitter mesa and aperture defined optical cavity of 6 um. The optical cavity is again located after the base and emitter contacts. Again, the active perimeter of this device is about 18 μm.

In the described types of devices, as above noted, the optical window or cavity is placed after the base and emitter contact. Due to the high base sheet resistant and large current gain (emitter current) of the tilted charge device, the voltage difference across the base emitter junction is greatest along the edge defined by the oxide aperture. As explained above, this forces the recombination events (which result in the desired optical output) to localize along the perimeter of the oxide aperture, as current injection is largest in the region where voltage difference is largest. The junction voltage decreases towards the center of the optical cavity, with attendant disadvantages.

Among the objects of the present invention are to overcome these and other limitations of existing light-emitting devices, such as the described tilted-charge light emitters, and to improve light emission of light-emitting and lasing semiconductor devices.

SUMMARY OF THE INVENTION

In a form of the present invention, the light-emitting semiconductor devices are configured to obtain uniformity of carrier injection into the base region, and the optical cavity between base and emitter electrodes does not cause a deleterious non-uniformity of voltage distribution between the emitter and base (or base/drain) electrodes of the device, as in the prior art.

In accordance with a form of the invention, a method is set forth for producing light emission from a two terminal semiconductor device with improved efficiency, including the following steps: providing a layered semiconductor structure including a semiconductor drain region comprising at least one drain layer, a semiconductor base region disposed on said drain region and including at least one base layer, and a semiconductor emitter region disposed on a portion of said base region and comprising an emitter mesa that includes at least one emitter layer; providing, in said base region, at least one region exhibiting quantum size effects; providing a base/drain electrode having a first portion on an exposed surface of said base region and a further portion coupled with said drain region, and providing an emitter electrode on the surface of said emitter region; applying signals with respect to said base/drain and emitter electrodes to obtain light emission from said base region; and configuring said base/drain and emitter electrodes for substantial uniformity of voltage distribution in the region therebetween.

In an embodiment of this form of the invention, the geometry of said emitter mesa between said electrodes is configured to promote substantial uniformity of voltage distribution in the region between the electrodes. In a form of this embodiment, the emitter mesa has a substantially rectilinear surface portion, and the step of providing said electrodes comprises providing said emitter electrode along one side of said surface portion of the emitter mesa and providing the first portion of said base/drain electrode on a portion of the base region surface adjacent the opposite side of said emitter mesa surface portion. The emitter electrode and said first portion of the base/drain electrode can be opposing linear conductive strips.

In accordance with another form of the invention, a method is provided for producing light emission from a three terminal semiconductor device with improved efficiency, including the following steps: providing a layered semiconductor structure including a semiconductor collector region comprising at least one collector layer, a semiconductor base region disposed on said collector region and including at least one base layer, and a semiconductor emitter region disposed on a portion of said base region and comprising an emitter mesa that includes at least one emitter layer; providing, in said base region, at least one region exhibiting quantum size effects; providing a collector electrode on said collector region, providing a base electrode on an exposed surface of said base region, and providing an emitter electrode on the surface of said emitter region; applying signals with respect to said collector, base, and emitter electrodes to obtain light emission from said base region; and configuring said base and emitter electrodes for substantial uniformity of voltage distribution in the region therebetween.

Further features and advantages of the invention will become more readily apparent from the following detailed description when taken in conjunction with the accompanying drawings.

BRIEF DESCRIPTION OF THE DRAWINGS

FIG. 10 shows a circuit model of device operation of the FIG. 9 embodiment.

FIGS. 11(a) and 11(b) show opposing base and emitter contact or electrode strips as employed in embodiments of the invention.

FIG. 16 is a table showing the semiconductor layers of an example of the FIG. 15 device.

DETAILED DESCRIPTION

Figure 9:
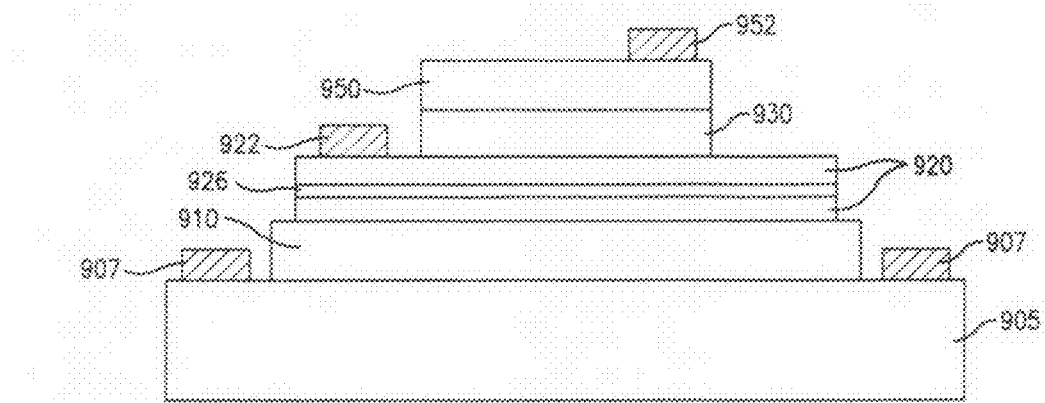
FIG. 9 is a cross-sectional diagram of an example of an improved tilted charge light-emitting transistor in accordance with an embodiment of the invention and which can be used in practicing an embodiment of the method of the invention.

FIG. 9 is a diagram of an improved tilted charge light-emitting transistor device in accordance with an embodiment of the invention. The devices hereof can be fabricated using, for example, conventional semiconductor deposition techniques for depositing III-V semiconductor layers and device fabricating and finishing techniques as described, for example, in the patents and publications listed in the Background portion hereof. From the bottom up, the device includes n+ subcollector region 905, n-type collector region 910, and p+ base region 920 containing quantum well 926. The emitter mesa includes n-type emitter layer 930 and n+ emitter cladding 950. In the present example, the device is an npn tilted charge light emitting transistor, it being understood that the principles hereof also apply to a pnp device. The collector electrode or contact metallization is represented at 907. The base contact is represented at 922, and the emitter contact is represented at 952.

In the embodiment of FIG. 9, the optical cavity is advantageously placed in between the emitter and base electrodes. The emitter resistance ($R_E$) is tuned relative to the emitter current to base current ratio (β+1) so that the voltage drop due to electron conduction equals the voltage drop due to base current as holes conduct laterally from the opposite direction. This results in a more uniform voltage drop across the base-emitter junction. Emitter resistance can be tuned by changing sheet resistances and by changing the geometry of the emitter mesa (FIG. 11, below).

FIG. 10 shows a circuit model of device operation of the FIG. 9 embodiment. In FIG. 10, the regions and contacts correspond with those of like reference numerals in FIG. 9. In the model, 1007, 1020, and 1030 respectively represent the collector, base, and emitter resistances, 1008 represents collector current components, and 1040 represents the spatial components of base/emitter voltage. As seen in the Figure, the voltage drops across the base-emitter junction are made substantially uniform so that V1, V2, V3 and V4 will be approximately the same. This means that the recombination events will be approximately uniform in the optical cavity.

A substantially symmetrical voltage drop across the base and emitter junction can be achieved by tuning the sheet resistance and geometry of the emitter mesa; e.g. by employing a geometry of the optical window or cavity (defined by in this case the exposed emitter mesa) to obtain the desired resistances. For example, the diagrams of FIGS. 11(a) and 11(b), show opposing base and emitter contact or electrode strips and, as the shaded area, the exposed emitter mesa from which generated light can be emitted. Compared to the "Type 2" device of FIG. 11(a), the "Type 1" device of FIG. 11(b) will exhibit larger emitter resistance and smaller base resistance.

Figure 12:
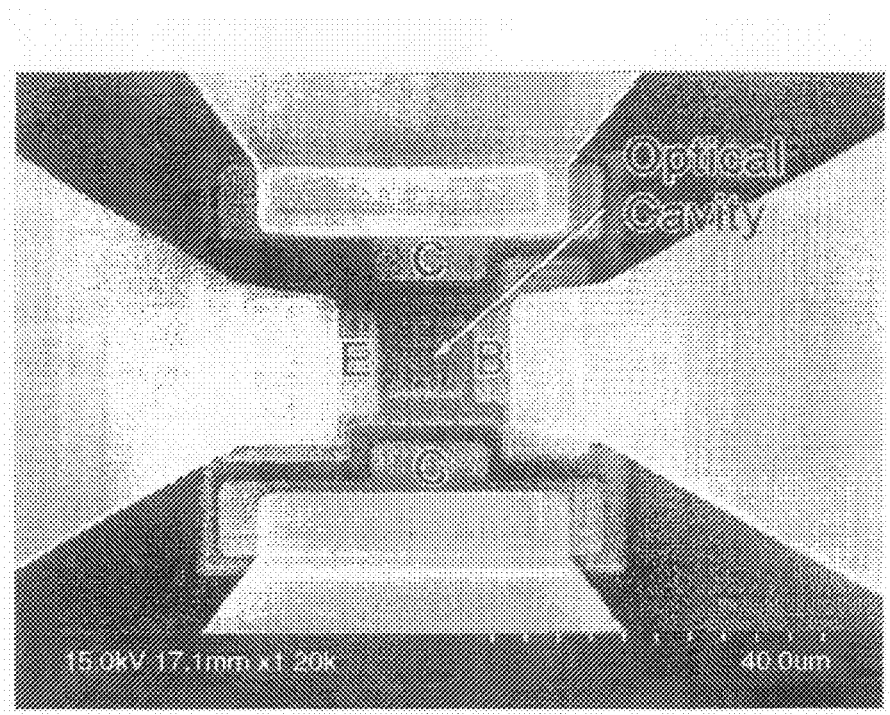
FIG. 12 is a top view photograph of a titled charge light emitting transistor with a 10 µm×10 µm Type 2 optical cavity design.

FIG. 12 is a top view photograph of a tilted charge light emitting transistor with a 10 μm×10 μm "Type 2" optical cavity or window design. An approximate symmetric voltage distribution to obtain uniform light emission is achieved by designing $R_B=(\beta+1)R_E$. The active perimeter of this device is 10 μm.

Figure 1:
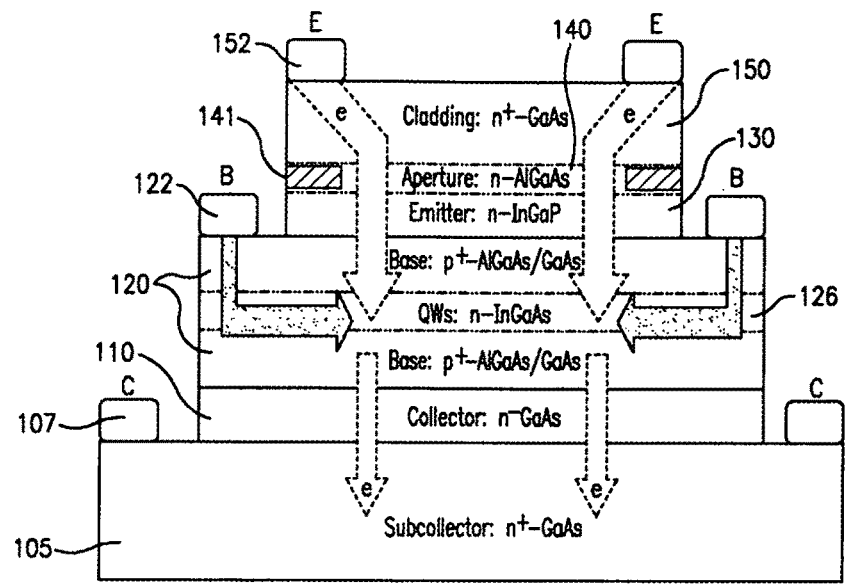
FIG. 1 is a cross-sectional representation of an example of an existing tilted charge light-emitting transistor device.
Figure 2:
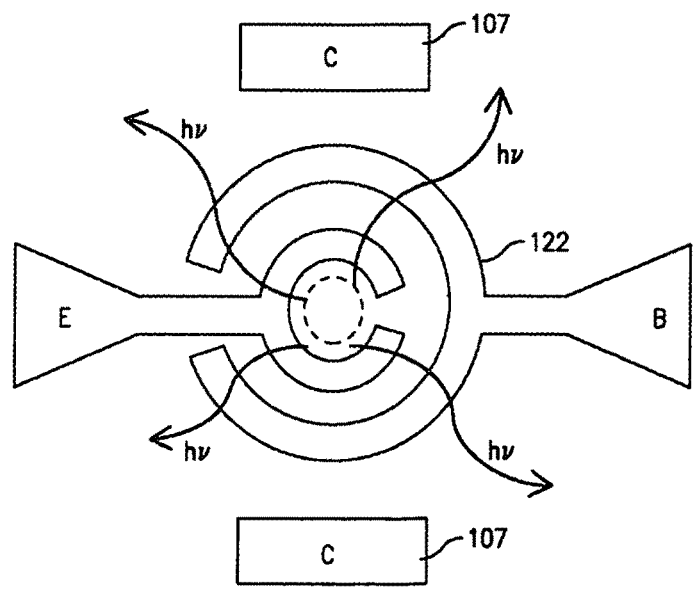
FIG. 2 is a plan view of the contacts or electrodes of the FIG. 1 device.
Figure 3:
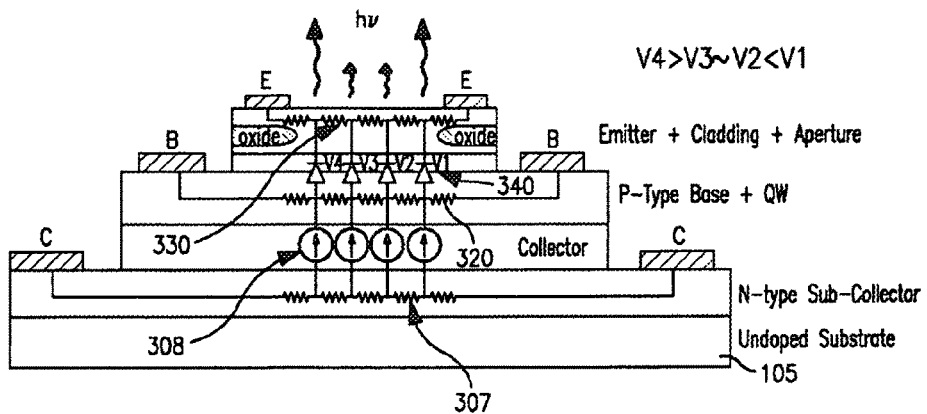
FIG. 3 is a circuit model representing the relevant operation of the FIG. 1 device.
Figure 4:
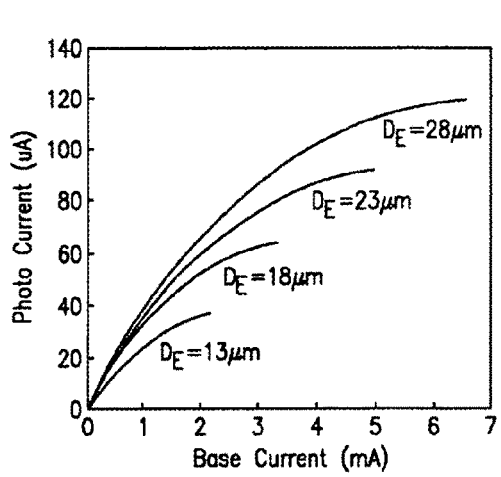
FIG. 4 is a graph showing optical output (as detector photocurrent) as a function of base current, for devices of different emitter diameters $D_E$.
Figure 5:
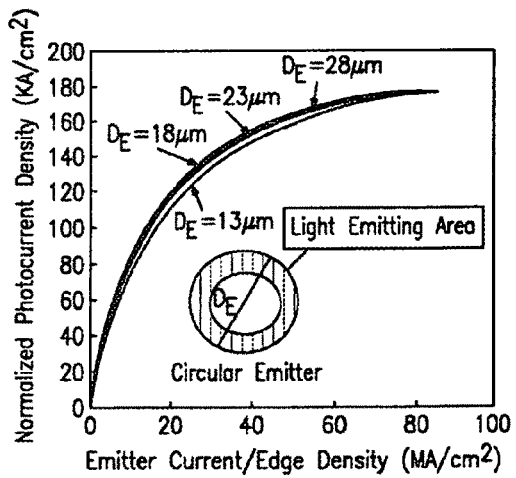
FIG. 5 shows a graph of normalized optical output density as a function of emitter current over edge density, for devices different emitter diameters, $D_E$. The inset shows a representation of the light emitting area, as a normalized aperture perimeter area. The area is determined by assuming a constant shallow penetration into the optical cavity.
Figure 6:
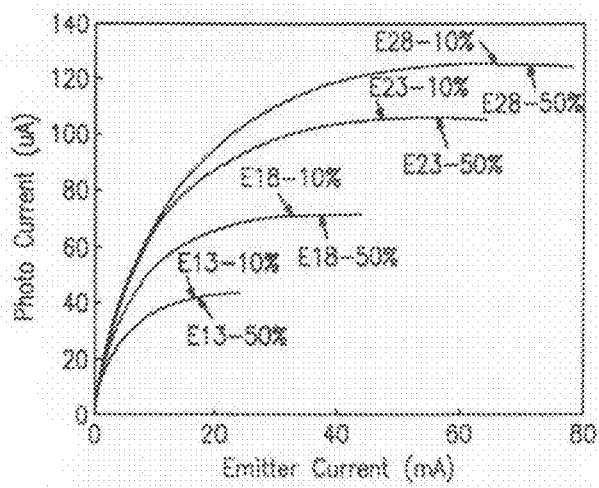
FIG. 6 shows photocurrent measurements as a function of emitter current for devices of various emitter sizes (in µm), showing 10% and 50% pulsed current points on each curve.
Figure 7:
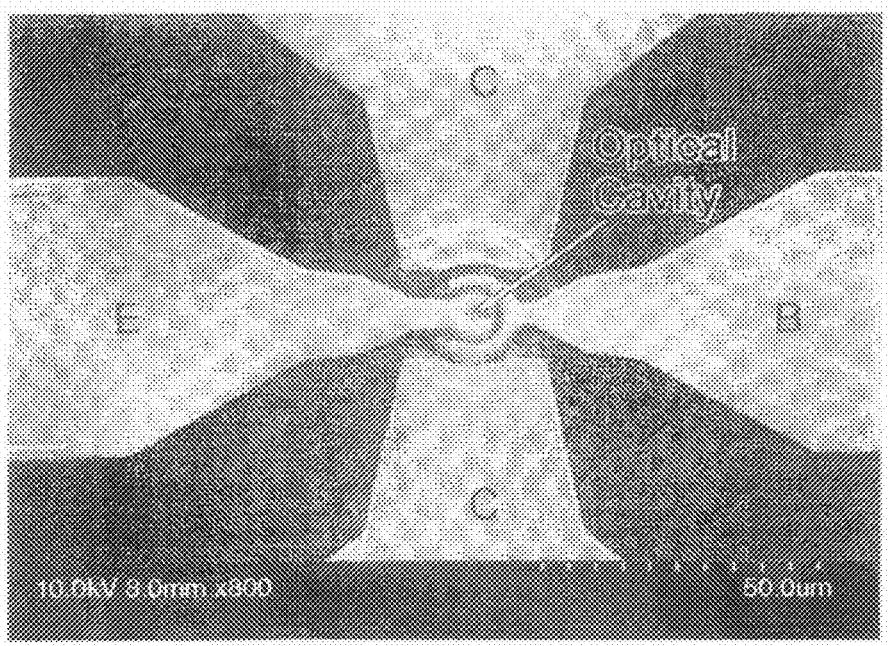
FIG. 7 is a top view photograph of the type of existing device of FIG. 1, wherein the collector (C), base (B), and emitter (E) metallizations are denoted, and the optical cavity is indicated by an arrow.
Figure 8:
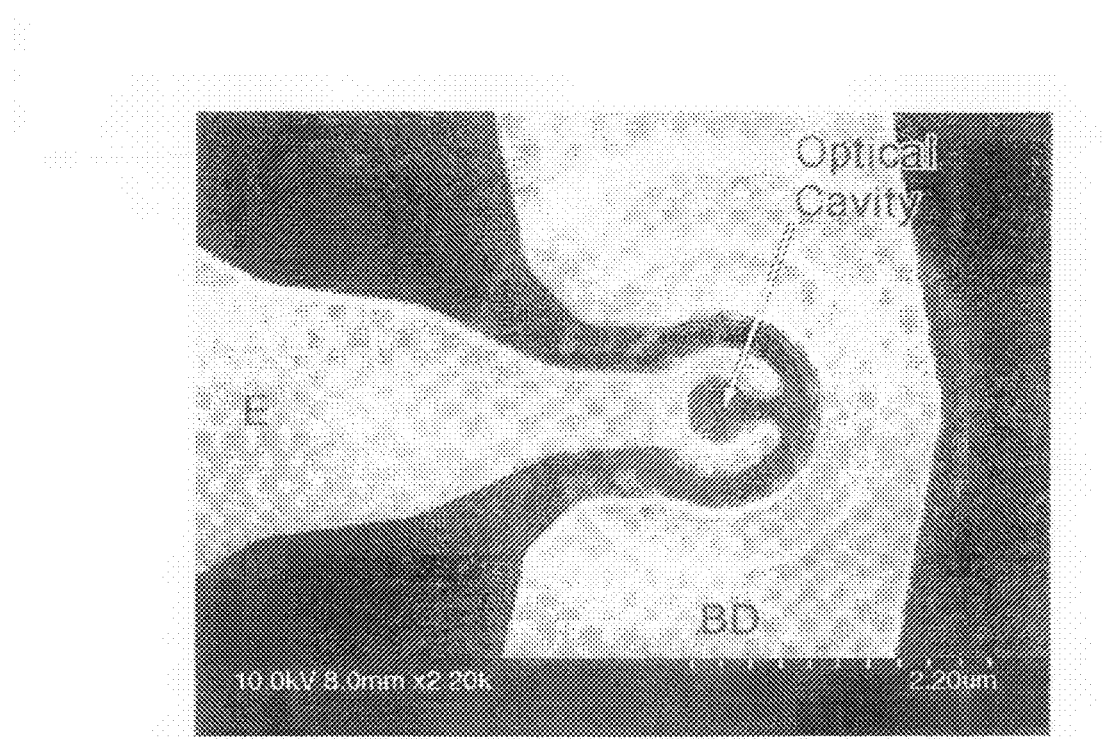
FIG. 8 is a top view photograph of a tilted charge light-emitting diode of the type described in copending U.S. patent application Ser. No. 12/655,806, filed Jan. 7, 2010, and assigned to the same assignees as the present application.
Figure 13:
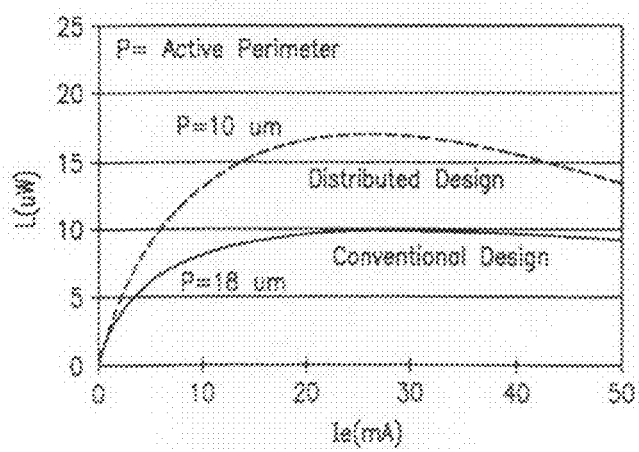
FIG. 13 shows the light-emitting transistor optical output (detector photo current) vs emitter current for the devices shown in FIG. 7 (solid line) and FIG. 12 (dashed line).

FIG. 13 shows the light-emitting transistor optical output (detector photo current) vs emitter current for the devices shown in FIG. 7 (solid line—existing device) and FIG. 12 (dashed line—example of an embodiment hereof). The distributed design structure hereof, despite having an active perimeter of 10 μm (FIG. 12), which is almost half of the 18 μm perimeter of the existing design (FIG. 7), is seen to be capable of about two times larger emitter current injection before reaching optical saturation. This indicates that a larger effective area of the optical window or cavity is involved in recombination as a result of the distributed design hereof.

Figure 14:
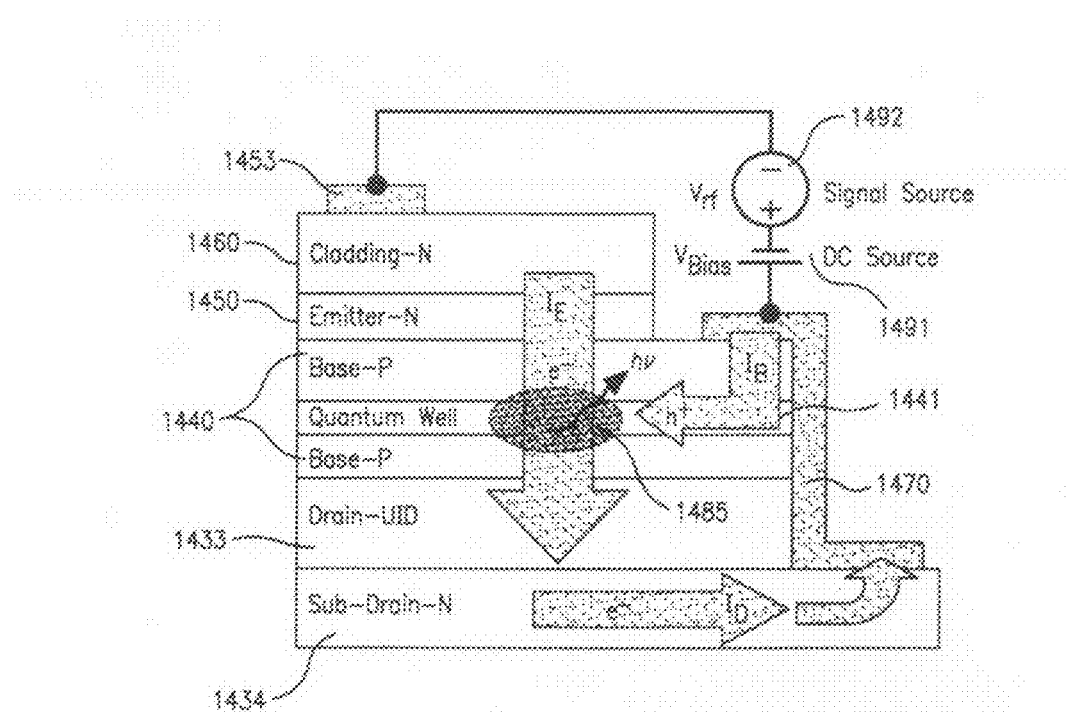
FIG. 14 is a simplified cross-sectional diagram of a two-junction tilted-charge light emitting diode in accordance with an embodiment of the invention.
Figure 15:
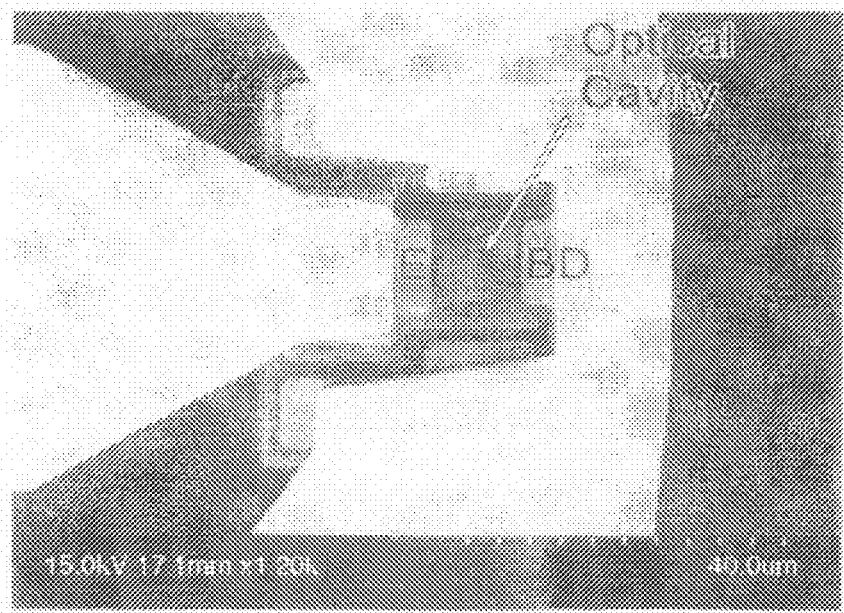
FIG. 15 is top view photograph of the device of FIG. 14, wherein the emitter (E) and base/drain (BD) metallizations are denoted, and the optical cavity is indicated by an arrow.

FIGS. 14 and 15 show a two-terminal tilted charge light-emitting diode of the type described in above-referenced copending U.S. patent application Ser. No. 12/655,806, filed Jan. 7, 2010, but having the distributed design feature of an embodiment hereof, with the optical cavity placed between the emitter and base/drain and the tuned emitter resistance. In FIG. 14, a p-type base region 1440 is disposed between unintentionally doped n-type drain region 1433 and n-type emitter region 1450, so that there is a first semiconductor junction between said emitter and base region and second semiconductor junction between the base region and the drain region. The base region 1440 includes quantum size region 1441, such as, for example, one or more quantum wells or one or more regions of the quantum dots. Below the drain 1433 is n-type sub-drain 1434. Above the emitter is an emitter cladding and contact region 1460. The emitter region has emitter electrode coupled thereto, in the form of emitter contact 1453. A base/drain electrode is coupled with the base and drain regions. The base/drain electrode is a metallic contact 1470 that is deposited, in this embodiment, on the base region and sub-drain region. As shown in FIG. 14, a positive bias voltage 1491 is applied to the base/drain contact 1470 with respect to the emitter contact 1453, and an AC voltage 1492 is also applied with respect to these contacts. The flow of electrons and holes in the FIG. 14 device is shown by the arrows in the Figure. Recombination in the base region, aided by the quantum well, results in light emission. Waveguide and cavity configurations can be added to this structure in order to allow this device to function as a two junction laser diode, two junction resonance cavity light emitting diode, or two junction vertical cavity transistor laser. (For example, typical upper and lower distributed Bragg reflectors (DBRs) can be provided in the FIG. 14 device to obtain an optical resonant cavity.) Radiative recombination is optimized in the active optical region, as represented in FIG. 14 at 1485. From the top view photograph of FIG. 15, the emitter and base/drain metallizations, and the optical cavity or window region of the FIG. 14 device can be seen.

For an example of the embodiment of FIG. 14 (see also Walter, Wu, Then, Feng, and Holonyak, Applied Physics Letters, 94, 231125 (Jun., 2009)), the epitaxial layers of the crystal used for making a two-junction tilted-charge light emitting diode includes, upward from the substrate, a 3000 Å n-type doped GaAs buffer layer, a 500 Å graded $Al_{0.30}Ga_{0.70}As$ confining layer, a 213 Å graded $Al_{0.30}Ga_{0.70}As$ to $Al_{0.90}Ga_{0.10}As$ oxide buffer layer, a 595 Å n-type $Al_{0.98}Ga_{0.02}As$ oxidizable aperture layer and another 213 Å graded $Al_{0.90}Ga_{0.10}As$ to $Al_{0.30}Ga_{0.70}As$ oxide buffer layer. A 557 Å n-type GaAs contact layer, a 120 Å InGaP etch stop layer, and a 2871 Å undoped "drain" layer are grown on top. The "drain" layer is just beneath the 1358 Å base layer, which includes two undoped 112 Å InGaAs quantum wells and an $Al_{0.05}Ga_{0.95}As$ layer with average doping of $3\times10^{19}$ $cm^{-3}$. The heterostructure emitter includes of a 511 Å n-type $In_{0.49}Ga_{0.51}P$ layer, a 213 Å graded $Al_{0.30}Ga_{0.70}As$ to $Al_{0.90}Ga_{0.10}As$ oxide buffer layer, a 595 Å n-type $Al_{0.98}Ga_{0.02}As$ oxidizable aperture layer, another 213 Å graded $Al_{0.90}Ga_{0.10}As$ to $Al_{0.30}Ga_{0.70}As$ oxide buffer layer, and a 500 Å graded $Al_{0.30}Ga_{0.70}As$ confining layer. The structure is completed with a 2000 Å GaAs top contact layer. The aperture is optional. Reference can be made to the table of FIG. 16, the last column of which indicates the layer description relative to the diagram of FIG. 15.

The two-junction tilted-charge LED is fabricated by first performing wet etching steps to form emitter and base-"drain" mesas, followed by an isolation etch from the sub-"drain" layer to the substrate. Metallization steps are then performed to provide the required electrical contacts. The completed LED has only two terminals: (a) a contact to the emitter layer, and (b) another across the base and "drain" layers (see FIG. 15). The base-"drain" forms a p-n junction with a reverse built-in field that is maintained by a common potential (zero potential difference) obtained via the common contact metallization extending to the base. The zero base-"drain" potential difference ensures that there is no base charge population density at the base-"drain" boundary, hence establishing the dynamic "tilted" emitter-to-"drain" population in the base, which was first described above. The "drain" layer performs therefore a role similar to the collector in a three-terminal HBLET. It allows excess minority carriers to be removed from the base ($I_D$), "swept" from base to "drain" by the built-in field at the base-"drain" p-n junction. Base carriers in transit from the emitter to the "drain" that do not recombine within the base transit time are removed, "drained". This enables fast modulation of the tilted-charge LED by preventing the build-up of "slow" charge in the base. The tilted-charge LED possesses the high speed optical modulation characteristics of an HBLET.

Figure 17:
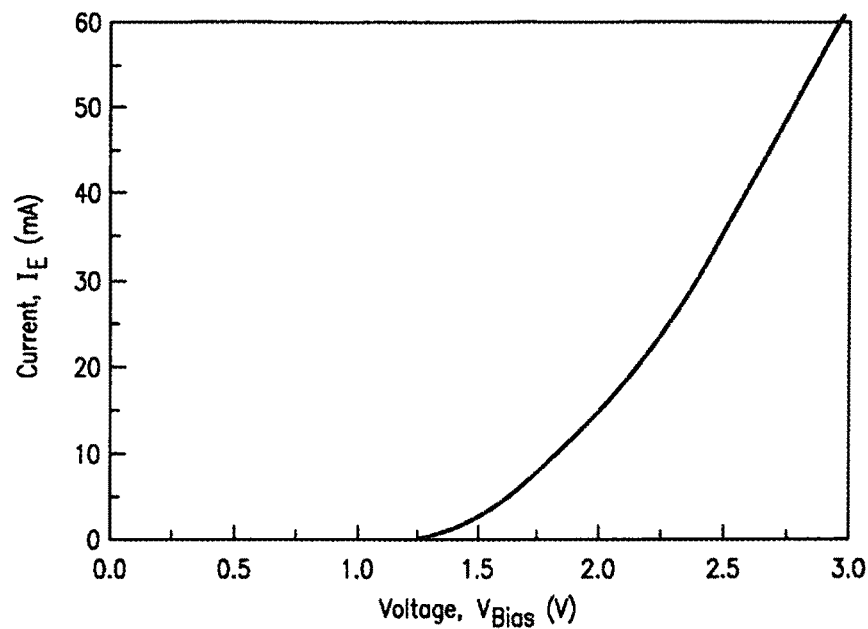
FIG. 17 shows the I-V characteristic of the device of FIGS. 15 and 16.
Figure 18:
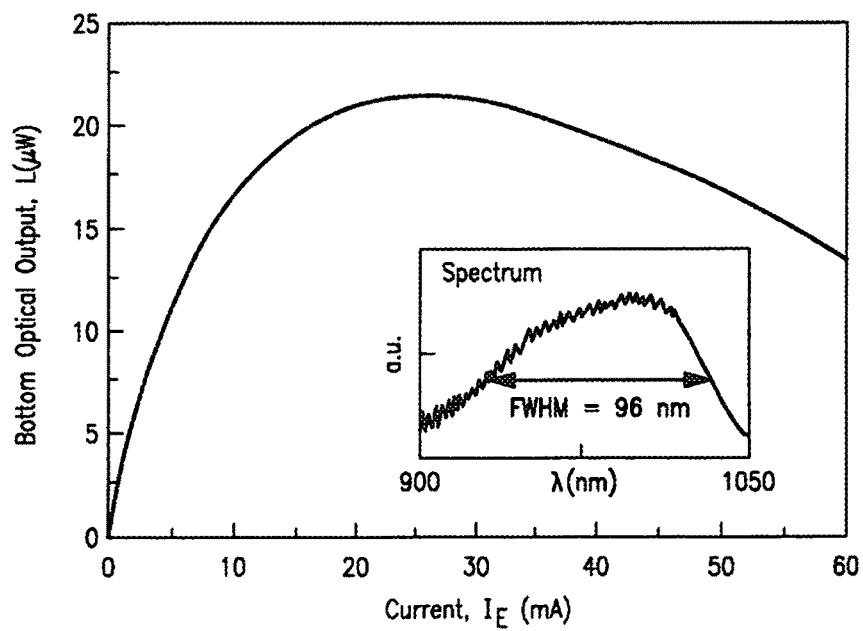
FIG. 18 shows the optical light output L-I characteristic of the FIG. 15, 16 device, measured from the device substrate bottom, and, in the inset, the output optical spectrum in arbitrary units.
Figure 19:
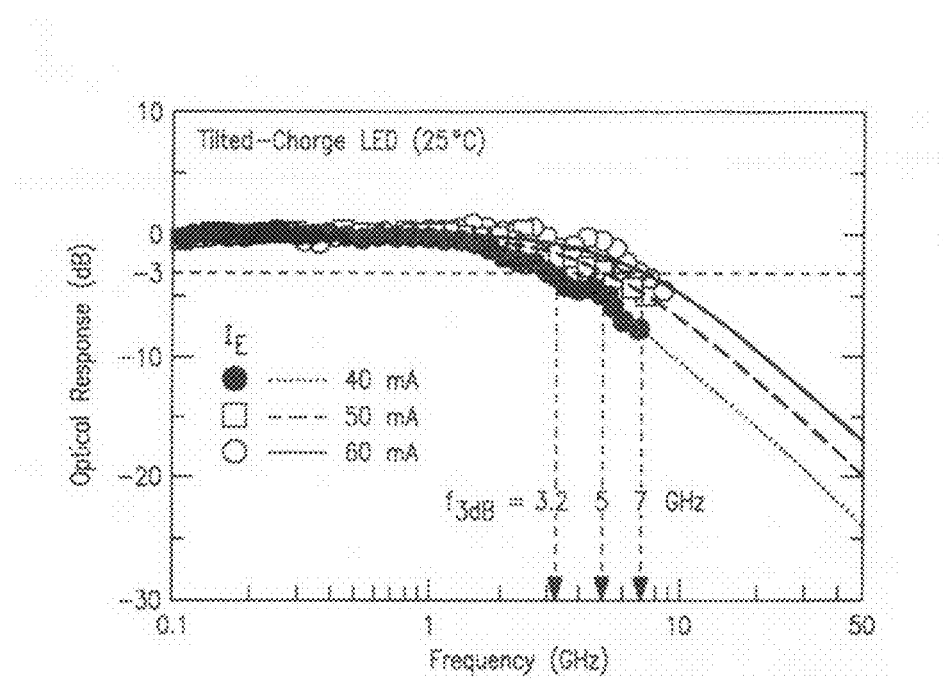
FIG. 19 shows the optical output response of the FIGS. 15, 16 device at bias currents $I_E$=40, 50, and 60 mA showing the −3 dB frequency $f_{3db}$ of 3.2, 5, and 7 GHz, respectively.

The tilted-charge LED can be biased as a usual two-terminal device, simply operating faster. Externally the tilted-charge LED displays an electrical I-V characteristic resembling that of a p-n junction diode (see FIG. 17). The "turn-on" voltage is determined by the emitter-base potential difference since the base and "drain" are metalized and unified in potential. The L-$I_E$ optical output characteristic, shown in FIG. 18, is obtained from the bottom emission (through the substrate) of the device. The broad radiative emission spectrum (FWHM ~96 nm) of the inset shows that the LED is operating in spontaneous recombination. The spectral peak occurs at λ=1000 nm, corresponding to the ground state transition (1.24 eV) of the InGaAs quantum-wells. The optical output saturates with $I_E$ beyond 10 mA as the internal "transistor" gain, $\beta=I_D/I_B$, increases resulting in the base (recombination) current, $I_B=I_E/(\beta+1)$ saturating. The optical output for this example is in the low microwatt range because the light extraction efficiency, assuming a single escape cone from the semiconductor GaAs-air interface, is only about 1.4%. To obtain the optical response of the device, the optical output is collected from the device top emission through a fiber, and measured with a 12 GHz p-i-n photodetector connected to an Agilent N5230A network analyzer. The optical response of the tilted-charge LED for $I_E$=40, 50, and 60 mA are shown in FIG. 19. The data show an excellent fit to a single-pole response of the form, $H(f)=A_o/(1+jf/f_{3\ dB})$ where $f_{3\ dB}=1/(2\pi\tau_B)$. For this example, a –3 dB bandwidth, $f_{3\ dB}$, of 7 GHz at $I_E$=60 mA is obtained, corresponding to an effective $\tau_B$=23 ps.

Figure 20:
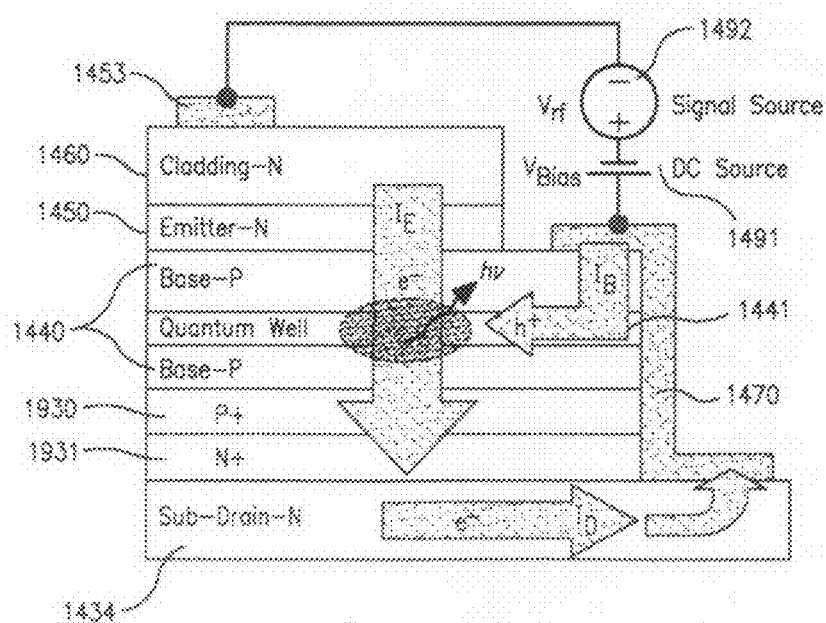
FIG. 20 is a simplified cross-sectional diagram of an embodiment of the invention that utilizes a tunnel junction as the device's drain region.

FIG. 20 shows another embodiment hereof which utilizes a tunnel junction as the drain region. Reference can be made, for example, to Tunnel Junction Transistor Laser, M. Feng, N. Holonyak, Jr., H. W. Then, C. H. Wu, and G. Walter, Appl. Phys. Lett. 94, 04118 (2009) and to U.S. Patent Application Publication No. US2010/0034228. In FIG. 20, elements with like reference numerals to those of FIG. 14 correspond to those elements of FIG. 14. In FIG. 20, the p+ layer 1930 of the tunnel junction is adjacent the base 1440 and the n+ layer 1931 of the tunnel junction is adjacent an n-type sub drain layer 1434.

The invention has been described with reference to particular preferred embodiments, but variations within the spirit and scope of the invention will occur to those skilled in the art. For example, appropriate reflectors can be employed to enhance extraction of output spontaneous optical emission. Also, where spontaneous emission LETs and diodes have been described, it will be understood that by employing appropriate reflective resonators, transistor lasers and diode lasers that benefit from the described features can also be devised.

The invention claimed is:

1. A method for producing light emission from a two terminal semiconductor device with improved efficiency, comprising the steps of:
providing a layered semiconductor structure including a semiconductor drain region comprising at least one drain layer, a semiconductor base region disposed on said drain region and including at least one base layer, and a semiconductor emitter region disposed on a portion of said base region and comprising an emitter mesa that includes at least one emitter layer and has a substantially rectilinear surface portion;
providing, in said base region, at least one region exhibiting quantum size effects;
providing a base/drain electrode having a first portion on an exposed surface of said base region and a further portion coupled with said drain region, and providing an emitter electrode on the surface of said emitter region;
applying signals with respect to said base/drain and emitter electrodes to obtain light emission from said base region; and
configuring said base/drain and emitter electrodes for substantial uniformity of voltage distribution in the region therebetween, including providing said emitter electrode along one side of said surface portion of the emitter mesa and providing the first portion of said base/drain electrode on a portion of the base region surface adjacent the opposite side of said emitter mesa surface portion, and providing said emitter electrode and the first portion of said base/drain electrode as opposing linear conductive strips of different lengths, so that the surface of emitter mesa between said strips is trapezoidal.

2. The method as defined by claim 1, further comprising providing an optical cavity for said light emission in the region between said first portion of the base/drain electrode and said emitter electrode.

3. The method as defined by claim 2, wherein said step of providing, in said base region, a region exhibiting quantum size effects comprises providing at least one quantum well.

4. The method as defined by claim 2, wherein said step of providing, in said base region, a region exhibiting quantum size effects comprises providing a plurality of quantum wells.

5. The method as defined by claim 1, wherein said step of providing, in said base region, a region exhibiting quantum size effects comprises providing at least one quantum well.

6. The method as defined by claim 1, further comprising providing an optical resonant cavity enclosing at least part of said base region, so that said light emission comprises laser emission.

7. The method as defined by claim 1, wherein said step of providing, in said base region, a region exhibiting quantum size effects comprises providing a plurality of quantum wells.

8. A two terminal light-emitting semiconductor device for producing light emission in response to electrical signals, comprising:
a layered semiconductor structure including a semiconductor drain region comprising at least one drain layer, a semiconductor base region disposed on said drain region and including at least one base layer, and a semiconductor emitter region disposed on a portion of said base region and comprising an emitter mesa that includes at least one emitter layer and having a substantially rectilinear surface portion;
said base region containing at least one region exhibiting quantum size effects; and
a base/drain electrode having a flange portion contacting an exposed surface of said base region and a further portion contacting said drain region, and an emitter electrode on the surface of said emitter region, said electrical signals being applied with respect to said base/drain and emitter electrodes to cause light emission from said base region;
said base/drain and emitter electrodes being configured to obtain substantial uniformity of voltage distribution in the region between said electrodes, including said emitter electrode being disposed along one side of said surface portion of the emitter mesa and said flange portion of said base/drain electrode being disposed on a portion of the base region surface adjacent the opposite side of said emitter mesa surface portion, and said emitter electrode and the flange portion of said base/drain electrode comprising opposing linear conductive strips, and said opposing linear conductive strips having different lengths, so that the surface of said emitter mesa between said strips is trapezoidal.

9. The device as defined by claim 8, further comprising an optical cavity for said light emission in the region between said flange portion of the base/drain electrode and said emitter electrode.

10. The device as defined by claim 9, wherein said region exhibiting quantum size effects comprises at least one quantum well.

11. The device as defined by claim 8, wherein said region exhibiting quantum size effects comprises at least one quantum well.

12. The device as defined by claim 8, wherein said drain region comprises a tunnel junction comprising an n+ layer and a p+ layer, with said p+ layer being adjacent said base region.

13. The device as defined by claim 8, wherein said region exhibiting quantum size effects comprises a plurality of quantum wells.

14. The device as defined by claim 9, wherein said region exhibiting quantum size effects comprises a plurality of quantum wells.

* * * * *